United States Patent [19]

Dolat et al.

[11] Patent Number: 4,672,254

[45] Date of Patent: Jun. 9, 1987

[54] SURFACE ACOUSTIC WAVE DEVICES AND METHOD OF MANUFACTURE THEREOF

[75] Inventors: Victor S. Dolat, Chelmsford; Daniel J. Ehrlich, Lexington, both of Mass.; Jeffrey Y. Tsao, Albuquerque, N. Mex.

[73] Assignee: Massachusetts Institute of Technology, Cambridge, Mass.

[21] Appl. No.: 786,585

[22] Filed: Oct. 11, 1985

[51] Int. Cl.$^4$ .................... H01L 41/04; H01L 41/18; B44C 1/22; C23F 1/02

[52] U.S. Cl. .............................. 310/313 R; 29/25.35; 156/643; 156/646; 156/656; 156/659.1; 219/121 LJ; 219/121 LM; 310/318; 333/193; 367/157; 427/53.1

[58] Field of Search ............ 156/643, 646, 656, 659.1; 204/192 EC, 192 E; 427/53.1; 357/25, 26; 219/121 LH, 121 LJ, 121 LM; 29/25.35; 310/311, 312, 313 R, 313 C, 313 D, 318; 367/37, 47, 48, 140, 157; 333/143, 194, 195, 193

[56] References Cited

U.S. PATENT DOCUMENTS 4,278,492  7/1981  Cross et al. ..................... 156/657 X
4,340,617  7/1982  Deutsch et al. .................... 427/53.1
4,442,574  4/1984  Wanuga et al. ............. 219/121 LM

OTHER PUBLICATIONS

"Automated Pulsed Technique for Measuring Phase and Amplitude Response of SAW Devices", J. H. Holtham & R. C. Williamson, *IEEE* 1978.
"L-Band Reflective-Array Compressor with a Compression Ratio of 5120", R. C. Williamson, V. S. Dolat & Henry I. Smith, 1973 *Ultrasonics Symposium Proc.* 1973.
"Surface Acoustic-Wave Devices", *McGraw-Hill Encyclopedia of Electronics and Computers*, 1984, pp. 793–796.
"Attenuating Thin Films for SAW Devices", A. C. Anderson, V. S. Dolat, & W. T. Brogan, *IEEE* 1980 *Ultrasonics Symposium*.
"Laser Direct Writing for VLSI", D. J. Erlich & J. Y. Tsao, *VLSI Electronics: Microstructure Science*, vol. 7, 1983.
"Laser Chemical Technique for Rapid Direct Writing of Surface Relief in Silicon", D. J. Ehrlich, R. M. Osgood, Jr., & T. F. Deutsch, *Appl. Phys. Lett.* 38(12), Jun. 1981, American Inst. of Physics.
"Nonreciprocal Laser-Microchemical Processing: Spatial Resolution Limits and Demonstration of 0.2-$\mu$m Linewidths", D. J. Ehrlich & J. Y. Tsao, *Appl. Phys. Lett.* 44(2), Jan. 1984, American Inst. of Physics.

*Primary Examiner*—William A. Powell
*Attorney, Agent, or Firm*—Hamilton, Brook, Smith & Reynolds

[57] ABSTRACT

A phase and amplitude compensated surface acoustic wave (SAW) structure is described in which computer controlled compensation is achieved by laser chemical etching of selective portions of a compound chemical film deposited on the surface of a piezoelectric SAW substrate in the path of propagation. The compound film comprises a layer of amplitude attenuating cermet material formed on the substrate and a phase compensating layer of molybdenum formed over the cermet material and in contact with the substrate surface.

26 Claims, 4 Drawing Figures

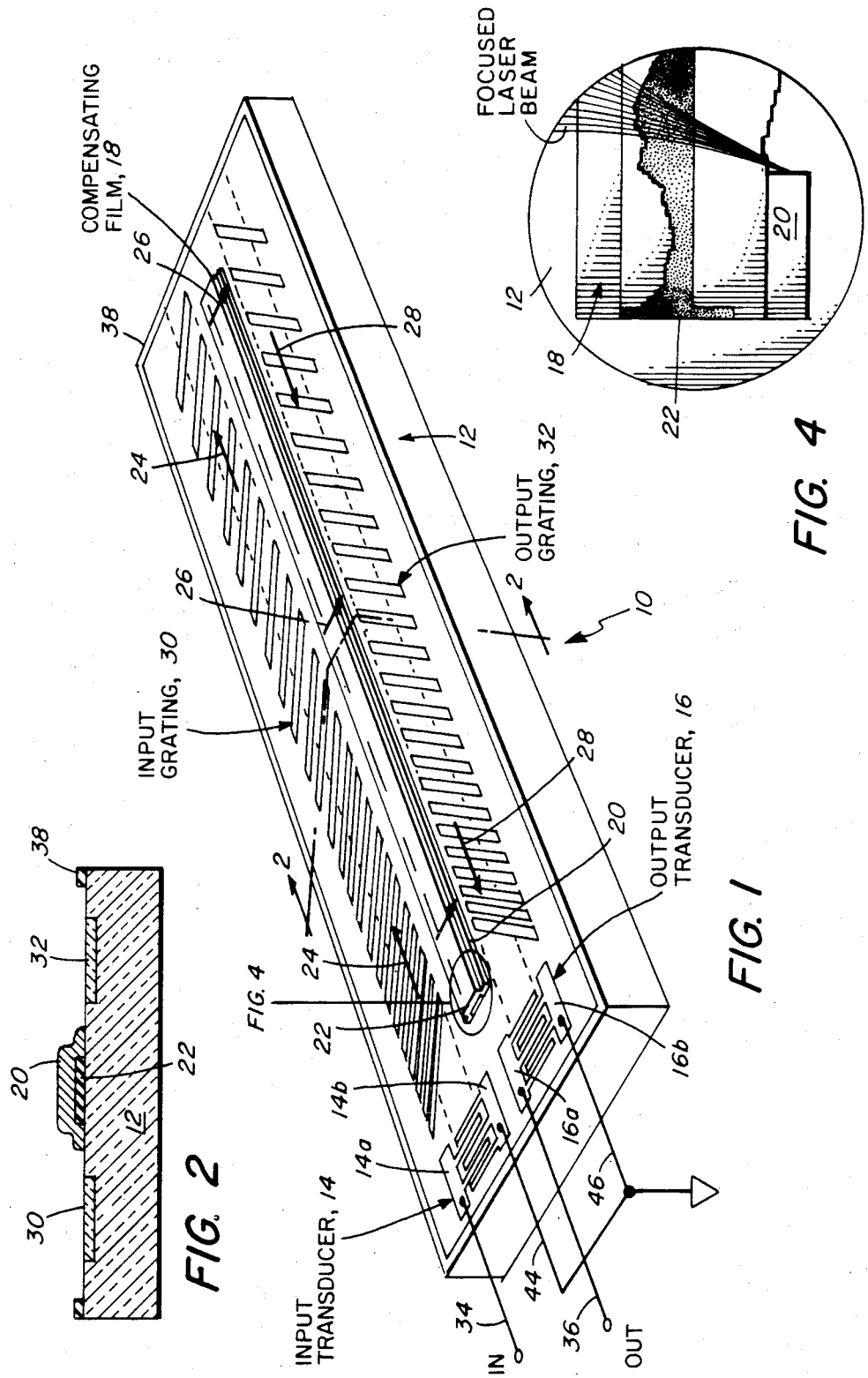

SURFACE ACOUSTIC WAVE DEVICES AND METHOD OF MANUFACTURE THEREOF

GOVERNMENT SUPPORT

The Government has rights to this invention pursuant to Contract No. AF19628-C-0002 sponsored by the United States Air Force.

TECHNICAL FIELD

This invention is in the field of Surface Acoustic Wave (SAW) devices and, more particularly, relates to a laser photo-chemical etching process for in situ trimming of thin film deposited on the surface of piezoelectric SAW structures.

BACKGROUND ART

Surface acoustic waves containing compressional and shear components in phase quadrature propagate non-dispersively along solid surfaces. This phenomena was predicted by Lord Rayleigh in the 1880's. More recently, microminiature SAW devices have been fabricated in which the surface acoustic waves are generated by electrical signals which are converted to acoustic signals by transducers formed on piezoelectric materials. These devices are used for the analog processing of electrical signals.

Significant SAW devices include bandpass filters, resonators and oscillators and pulse compression filters. System applications for such devices are numerous and include color television, radar, sonar, communication, non-destructive testing and fast Fourier transform processors.

The basic SAW structure comprises an InterDigitated metal film Transducer (IDT) deposited on a planar optically polished surface of a piezoelectric substrate, such as lithium niobate or quartz niobate. In Reflective Array Compressor (RAC) SAW devices the acoustic wave generated by the IDT is propagated along an array of suitably angled reflective slots etched into the substrate surface. These slots form a dispersive delay line grating. The spacing of the slots determines the frequency selectivity of the grating and the depth of the slots determines the amplitude weighting applied to the input pulse. Two such gratings are arrayed side-by-side on the substrate surface. The slots on the second grating are matched to the first to reform and counterpropagate the SAW beam parallel to but laterally displaced from the incident SAW beam (*McGraw-Hill Encyclopedia of Electronics and Computers*, 1984, pp. 793–796).

Slot depths are typically 1/100th of the acoustic wavelength, and slot spacings are typically one wavelength between centers. Needless to say, such stringent requirements necessitate extremely precise fabrication techniques. In practice, there is a significant amount of device-to-device variation, due to the sensitivity of device performance to fabrication steps.

In addition, even if fabrication technology were perfect, it is difficult to exactly predict device performance from device design because of substrate variability.

Due to these difficulties, viz., imperfect device design, imperfect device fabrication and substrate variability it is important to develop an ability to correct device performance after fabrication.

Phase compensation of pulse compression SAW gratings has been suggested as a means for improving device response by Williamson et al. in *L-Band Reflective-Array Compressor with a Compression Ratio of 5120*, Ultrasonics Symposium Proceedings, Williamson et al., *IEEE*, New York, 1973 pp. 490–493. Williamson et al. contemplate placing a metal film of variable width between the two grating structures to slow the wave and advance its phase (p. 492). In practice, the photolithographic processing required to define the film pattern perturbs both the amplitude and phase response of the wave and precludes independent phase adjustment beyond 2 degrees r.m.s. or less.

No known amplitude-compensation technique, short of complete iteration of device fabrication with a modified groove-depth profile, has previously been demonstrated.

DISCLOSURE OF THE INVENTION

In accordance with the invention, a compound SAW compensating film comprising first and second layers is deposited on the surface of a piezoelectric SAW substrate, preferably formed of $LiNbO_3$, between the two conventional grating structures. The first layer is comprised of an amplitude attenuating material intermediate the resistivity of a metal and a dielectric. Preferably, in the range of $10^{+3}-10^{+9}$ ohms/sq. The precise resistivity depends on the SAW substrate material. The second film layer is a metallic phase compensating layer of electrically conductive material, such as molybdenum. The second layer is deposited over the cermet layer and extends laterally beyond the cermet layer onto the substrate surface between the grating structures.

This compound film is initially patterned to the approximate desired dimensions using conventional photolithography masking techniques.

The second layer of metallic conducting material effectively masks or short-circuits the cermet attenuating first layer. Thus, by selectively removing portions of the second layer overlying the first layer, the wave can be amplitude compensated. Subsequently, or concurrently, by selectively removing portions of the second layer overlying the substrate, the wave can be phase compensated.

To do this, the SAW device, including the compound film of the invention, is made operational by bonding input and output leads to the transducers and is loaded into a laser etching chamber. The device is energized and the phase and amplitude characteristics measured by well-known techniques, using a network analyzer. To the extent these characteristics deviate from the ideal; the second layer, or film, of molybdenum is laser photo chemically etched to remove selected portions and to thereby compensate the SAW wave independently in phase and/or amplitude.

The photochemical etching process produces a fast low temperature reaction without damaging the underlying $LiNbO_3$ substrate, which is extremely susceptible to damage from nonlinear optical absorption and localized heating. In this etching process low power laser light is focused on the selected portion of the film to be removed while a flowing vapor containing an etchant reactant, such as $Cl_2$, is passed over the film. Light photons dissociate the vapor reactant producing free atoms of Cl which combines with the heated metal film to etch the film and produce volatile vapors which are evaporated and exhausted.

BRIEF DESCRIPTION OF THE DRAWINGS

FIG. 1 is a simplified prospective view of a SAW device in accordance with the invention.

FIG. 2 is a sectional view of the device of FIG. 1, taken along the lines 2—2.

FIG. 4 is an enlarged view of a portion of the top surface of the SAW device of FIG. 1 showing the trimming operation in progress.

BEST MODE OF CARRYING OUT THE INVENTION

Figure 3:
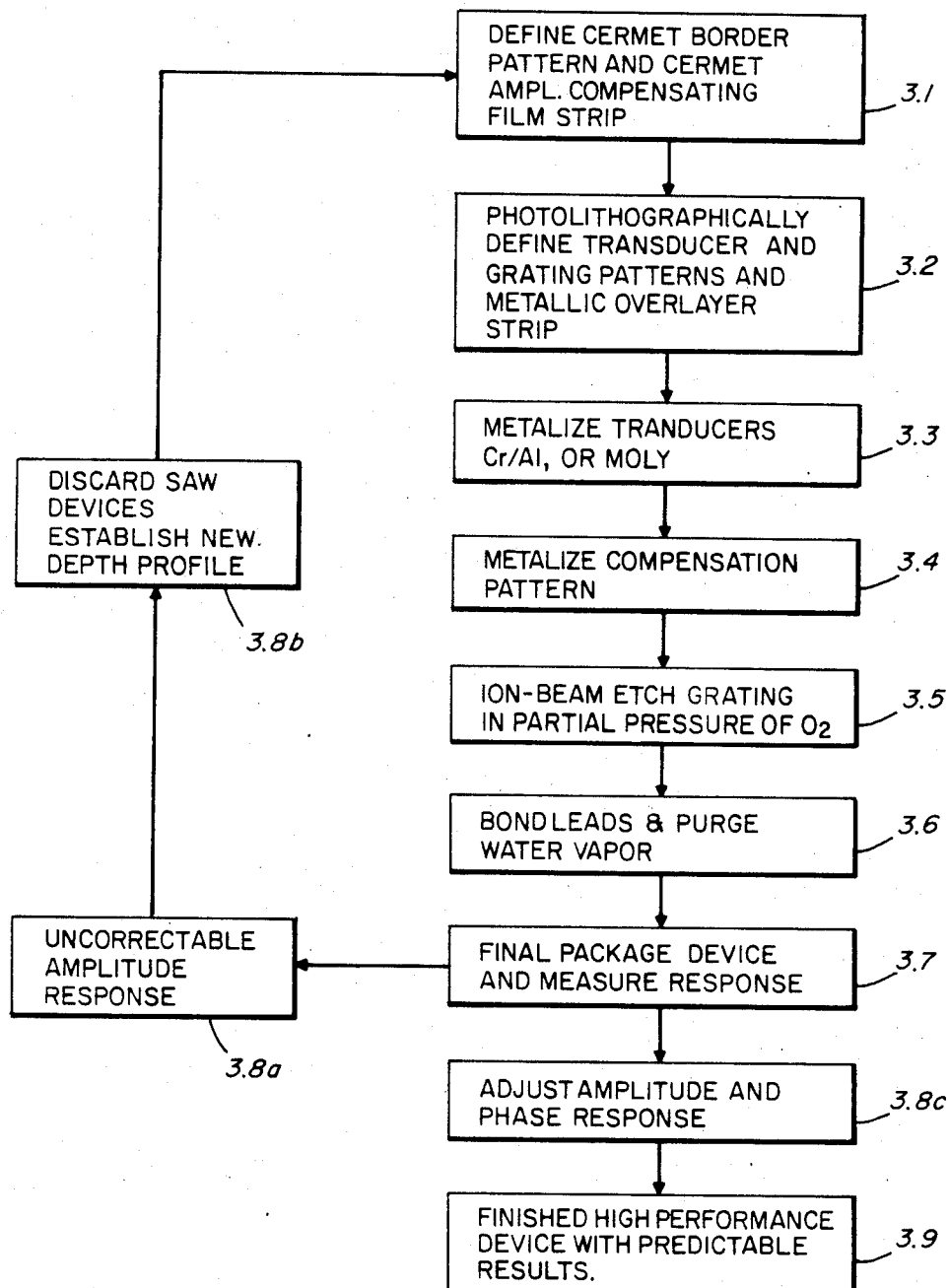
FIG. 3 is a process flow diagram of the method of fabricating a SAW device in accordance with the invention.

Referring now to FIGS. 1-4, a preferred embodiment of the invention will be described in detail in connection therewith. As shown therein, a SAW device 10, in the form of a reflective array compressor, generally comprises a piezoelectric substrate 12, preferably LiNbO$_3$, or quartz, having an input transducer 14 and an output transducer 16 formed on a longitudinally planar surface of the substrate 12. Parallel disposed dispersive delay line gratings 30 and 32 are etched into the surface of the substrate 12 longitudinally adjacent input transducer 14 and output transducer 16, respectively.

Input transducer 14 comprises a metal film in the form of interdigitated fingers 14A and 14B, respectively. An electrical signal at input lead 34 is transformed by input transducer 14 into a SAW signal which is propagated along the path of arrows 24 passed an array of suitably angled reflective slots or input gratings 30 etched into the surface of substrate 12. This Surface Acoustic Wave signal is coupled tranversely from input grating 30 in the direction of arrows 26 to output grating 32 and counter-propagated in the direction of arrows 28 to output transducer 16. Transducer 26 converts the SAW signal into an electrical signal which is coupled from the reflective array compressor 10 to output lead 36 bonded to transducer finger 16b. Interdigitated fingers 14B and 16A are suitably grounded, as shown.

A cermet film border 38 is formed around the periphery of the upper, or wave, surface of substrate 12 to suppress spurious signals caused by SAW beam edge reflections.

In the longitudinal space between the input grating 30 and the output grating 32, a compound compensating film 18 is provided, in accordance with the invention. This compound film 18 comprises a first layer 22 of attenuating material which is deposited onto the top surface of substrate 12 using metal masking techniques and a second layer 20 of a metallic conducting material which is deposited over layer 22 in contact therewith and extending beyond the cermet layer 22 onto the top surface of substrate 12, as shown in detail in the FIG. 2 cross-section. Layer 22 should preferably comprise a cermet material which is compatible with the substrate and has an ohms/square value intermediate a metal and a semiconductor, i.e., about $10^6$ ohms/square. For an LiNbO$_3$ substrate we have found a cermet of Cr-Cr$_2$O$_3$ to be a good compromise material for layer 22. A vapor etchable conductor such as molybdenum, tungsten, gold, or tantalum is chosen for layer 20. Molybdenum has proven satisfactory in prototype models.

After the device, as shown in FIGS. 1 and 2, is constructed and suitably packaged and rendered operable, the amplitude and phase characteristics are measured using conventional techniques (See, for example, *Automated Pulsed Technique for Measuring Phase and Amplitude Response of SAW Devices*, J. H. Holtham et al., 1978, Ultrasonic Symposium Proceedings, *IEEE*, Cat. No. 78CH1344-1SU, pages 607-610).

If the response is deemed to be uncorrectable, the device is discarded and a new depth profile established on another substrate. If, however, in accordance with the invention, the amplitude response is deemed to be correctable, the amplitude and phase response is corrected by subjecting the compensating film 18 to a laser chemical etching procedure wherein the second layer 20 of molybdenum material is appropriately trimmed under computer control without disturbing the underlying cermet layer 22 or the substrate.

A significant advantage of this laser etching procedure is that the overlaying conductive molybdenum film 20 can be cleanly removed by laser etching without disturbing either the underlying cermet layer 22 or the substrate. Simple laser ablation, as is used presently in other trimming applications, is unacceptable, due to damage to the underlying material. The amplitude attenuating characteristic of the cermet layer is thereby retained.

The conductive molybdenum layer 20 over the cermet layer 22 renders the combined compensating film 18 non-attenuating to the SAW wave. Therefore, controlled removal of the molybdenum layer 20 from circuit layer 22 may be employed to uncover regions of the cermet layer 22 to produced the desired attenuation. Removal of portions of the molybdenum layer 20 from the substrate surface results in phase change of the propagated SAW wave as it passes from the input grating 30 to the output grating 32 along the path of the compensating film 18.

Further details of the method of fabrication will be explained in connection with the process drawing of FIG. 3. As shown therein, the first step (3.1) of the process is to define the cermet border 38 around the periphery of the substrate and, at the same time, to define the cermet amplitude compensating film strip 22. A metal masking technique is preferable.

Next, the transducer and grating patterns and metallic overlayer strip are photolithographically defined, (Step 3.2). Then in Step 3.3, the interdigitated transducer structure is metallized using chromium-/aluminum or molybdenum.

In Step 3.4, the compensation pattern is completed by depositing a compound layer, comprising a Cr-Cr$_2$O$_3$ cermet underlying a molybdenum overlayer; the pattern of the compound layer being previously approximately dimensionally defined in Step 3.2.

Good film properties have been obtained by sputter deposition of the cermet layer at 170 angstroms per minute, using a target with the composition volume ratio of Cr to Cr$_2$O$_3$ being 30-70, in a sputter chamber with a base pressure of $2 \times 10^{-7}$ Torr. The molybdenum film may be deposited by conventional thin-film deposition processes.

It is important to avoid mass loading and consequent deflection of the surface acoustic wave. This is accomplished by keeping the layer thickness in the range of 20-40 nanometers thickness for each layer.

After the compensation pattern is metallized in Step 3.4, the gratings 30 and 32 are ion beamed etched (Step 3.5). Leads 34, 36, 44 and 46 are bonded to the input and output transducers, 14 and 16, and the device is vacuum packaged (Step 3.6). The package is then evacuated for 15 minutes with a cryogenically trapped vacuum system to eliminate any physically adsorbed water vapor. A flowing atmosphere of 200 Torrs of $Cl_2$ vapor is introduced to the package and allowed to further purge the package of water for a period of 10 minutes, (Also included in Step 3.6).

Next, the phase and amplitude response characteristics of the packaged device are measured using well-known network analyzer techniques (Step 3.7). If the response is such that the amplitude and phase response can be corrected using the compensating film of the invention, Step 3.8(c) is warranted. If not, the device is discarded and a new depth profile is established on a new substrate, [Steps 3.8(a) and 3.8(b)].

In Step 3.8(c), the packaged SAW device fabricated in accordance with Steps 3.1-3.7 is placed in a laser etching apparatus and while the device is operated, the molybdenum layer 20 is trimmed under computer control by a low power laser photochemical etching process to achieve the desired amplitude and phase response. (See enlarged view of FIG. 4.) The photochemical reaction involves the photochemical dissociation of a flowing $Cl_2$ vapor at ambient temperature by absorption of the protons of laser light to produce atomic chlorine. The atomic chlorine reacts with the laser heated portions of the molybdenum film, to form complex volatile molybdenum/chloride vapors which evaporate and are exhausted.

In one example, a 514.5 nanometer argon-ion laser beam of 150 milliwatts may be employed in this etching step to focus a laser spot of about 4 micrometers in diameter onto the selected portions of the molybdenum layer 20; while a vapor flow of chlorine is passed over the substrate surface at ambient temperature. (See enlarged view of FIG. 4.). The device is raster scanned under the focussed laser beam utilizing a computer for computer controlled raster scan.

Alternatively, a 488.0 nanometer argon-ion laser wavelength may be employed. In either procedure, the overlying molybdenum layer 20 is cleanly removed by the laser etching, Step 3.8(c), without disturbing the underlying cermet layer 22. Thus the amplitude attenuation characteristics of the cermet layer 22 is retained.

Since the trimming adjustment proceeds in situ, the procedure enables one to improve both the amplitude and phase accuracy of the finished device. For each strip of 0.25 micrometers of molybdenum removed from over the $LiNbO_3$ substrate surface, a measured phase change of 0.15° was observed at a test frequency of 250 megahertz. Similarly, etching molybdenum in 0.25 micrometer strips to uncover the cermet layer 22 produced a measured attenuation of 0.5 dB per wavelength for z directed SAW, which corresponds to a change of 0.01 dB at 250 megahertz for each 0.25 micrometers of uncovered cermet layer 22.

After the trimming is accomplished, the $Cl_2$ vapor is purged from the package by a 1 atmosphere flow of dry nitrogen gas. The result is a fully phase and amplitude compensated SAW device, (Step 3.9) without physically handling the substrate.

EQUIVALENTS

This completes the description of a preferred embodiment of the method and apparatus of the invention. Those skilled in the art will recognize or be able to ascertain, using no more than routine experimentation, many equivalents or alternatives to the specific embodiments in the invention described herein. For example, while the preferred embodiment refers to removal of metal films, the reverse process is also contemplated wherein a metal film may be deposited in an appropriate compensating pattern using laser chemical deposition. In this process a Ti film is deposited over the cermet for phase compensation using a $TiCl_4$ reactant vapor and a 257 nanometer laser source. U.S. Pat. No. 4,340,617 describes a suitable deposition process.

In addition to, or in lieu of trimming the molybdenum layer between the grating structure it is possible to modify the IDT itself by lengthening or shortening the fingers of the IDT and thereby adjust the phase and amplitude of the SAW directly using the above described etching process for shortening and the deposition process for filling in the metal fingers. The response of conventional IDT bandpass filters and resonators may be successfully trimmed applying these procedures. Also, electron beam or focused-ion beam trimming may be substituted for the laser photochemical etching process. Such equivalents or alternatives are intended to be encompassed by the following claims.

We claim:

1. A method of compensating of surface acoustic wave (SAW) devices comprising the steps of:
   (a) forming a piezoelectric substrate;
   (b) forming transducer means on the surface of said substrate for converting an electrical signal to an acoustic wave signal which propagates along the surface of the substrate;
   (c) forming a compensating film in the path of the acoustic signal by forming:
      (i) a first layer of amplitude attenuating material on the surface of said substrate, and
      (ii) a second conductive layer over said first layer in contact with both said first layer and said substrate surface.

2. The method of claim 1 wherein the first layer is a material having a resistivity intermediate that of a metal and a dielectric and the second layer is a metal.

3. The method of claim 1 wherein the device is packaged and operated and its amplitude and phase characteristics measured and the second layer is selectively removed until the measured operational phase and amplitude characteristics of the device are satisfactory.

4. The method of claim 3 wherein the first layer is a cermet and the second layer is a vapor etchable metal.

5. The method of claim 1 wherein the device is disposed in a reaction chamber with a chemical reactant vapor and selective removal of the second layer is accomplished by laser photochemical etching.

6. The method of claim 1 wherein the reactant vapor is a halogen chemical.

7. A surface acoustic wave device comprising:
   (a) a substrate;
   (b) transducer means formed on the surface of said substrate for converting an electrical signal to a surface propagated acoustic wave (SAW) signal;
   (c) compensating film means in the path of said SAW signal comprising:
      (i) a first layer on the surface of said substrate comprised of amplitude attenuating material, and
      (ii) a second conductive layer formed over said first layer in contact with both said first layer and said substrate surface with portions thereof selectively removed to compensate said SAW signal in phase and amplitude.

8. The device of claim 7 wherein the second layer is a vapor etchable metal conductor.

9. The device of claim 7 wherein portions of the second layer are selectively removed by laser photochemical etching to compensate the phase and amplitude response of the device.

10. A method of phase and amplitude compensating a SAW device having a substrate with transducer means and a pair of grating means formed on the substrate comprising the steps of:
   a. patterning a compound compensating film on the substrate surface of attenuating and conductive film layers in which the conductive layer masks the attenuating ability of the first layer;
   b. selectively removing portions of the conductive layer overlying the first layer to amplitude compensate the device; and
   c. selectively removing portions of the conductive layer overlying the substrate to phase compensate the device.

11. The method of claim 10 wherein the device is made operational by bonding input and output leads to the transducer means and loading the device into a laser etching chamber; energizing the device and measuring the phase and amplitude characteristics and to the extent these characteristics deviate from the ideal; selectively removing the conductive layer by laser etching to remove selected portions and to thereby compensate the device in phase and/or amplitude.

12. The method of claim 1 wherein the device is packaged and operated and its amplitude and phase characteristics measured and material is selectively added to the second layer until the measured operational phase and amplitude characteristics of the device are satisfactory.

13. The method of claim 12 wherein the added material is supplied by laser chemical vapor deposition.

14. The process of trimming a metallic conductor on a piezoelectric substrate by flowing a vapor past said substrate having a reactant chemical which is capable of etching said conductor and focusing a low power laser beam on the selected portion of the conductor to be etched to locally heat the selected portion while locally disociating the reactant chemical from the vapor to form a volatized reactant/metal product which removes the metal from the portion without damaging the substrate.

15. The process of claim 14 wherein the substrate is LiNbO$_3$ and the metal is molybdenum or tantalum and the reactant is Cl$_2$.

16. A method of phase and amplitude compensating of an acoustic surface wave device comprising the steps of:
   (a) forming a piezoelectric substrate;
   (b) forming transducer means on the surface of said substrate for converting an electrical signal to an acoustic wave signal;
   (c) forming grating means in the path of propagation of said acoustic signal for reflecting said acoustic signal;
   (d) forming compensating film means laterally adjacent said grating means for amplitude and phase compensating the surface acoustic wave signal reflected from said grating means by forming:
      (i) a first layer of amplitude attenuating material on the surface of said substrate, and
      (ii) a second conductive layer over said first layer in contact with both said first layer and said substrate surface.

17. The method of claim 16 wherein the first layer is a cermet and the second layer comprises molybdenum.

18. The method of claim 16 wherein the device is packaged and operated and its amplitude and phase characteristics measured and the second layer is selectively removed until the measured operational phase and amplitude characteristics of the device are satisfactory.

19. The method of claim 16 wherein the first layer is a cermet and the second layer is a conductor from the class comprising: molybdenum, tantalum, gold and titanium.

20. The method of claim 18 wherein the device is disposed in a reaction chamber with a chemical reactant vapor and selective removal of the second layer is accomplished by laser chemical etching.

21. The method of claim 20 wherein the reactant vapor is a chemical taken from the group comprising: chlorine, fluorine and bromine.

22. A phase and amplitude compensated acoustic wave device comprising:
   (a) a substrate;
   (b) transducer means formed on the surface of said substrate for converting an electrical signal to a surface acoustic wave (SAW) signal;
   (c) grating means in the path of propagation of said SAW signal for reflecting said SAW signal;
   (d) compensating film means laterally adjacent said grating means for compensating the surface acoustic wave signal reflected from said grating means, said compensating film means comprising:
      (i) a first layer on the surface of said substrate comprised of amplitude attenuating material, and
      (ii) a second conductive layer of vapor etchable material formed over said first layer in contact with both said first layer and said substrate surface.

23. The device of claim 22 wherein the second layer is a conductor taken from the group comprising: tungsten, tantalum, gold or molybdenum.

24. The device of claim 22 portions of the second layer are selectively removed by laser photochemical etching to compensate the phase and amplitude response of the device.

25. A method of phase and amplitude compensation of a SAW device having a piezoelectric substrate with transducer input and output means formed by a metal film on the substrate comprising the steps of:
   a. selectively adding portions to the transducer means by flowing a reactant vapor past the film while a low power laser beam is focused on the spot where deposition is to be accomplished.

26. A method of phase and amplitude compensation of a SAW device having a piezoelectric substrate with transducer input and output means formed by a metal film on the substrate comprising steps of:
   a. selectively removing portions of the transducer means by flowing a reactant vapor past the film while a low power laser beam is focused on the spot where removal is to be accomplished.

* * * * *